United States Patent [19]
Ahn et al.

[11] Patent Number: 5,583,069
[45] Date of Patent: Dec. 10, 1996

[54] METHOD FOR MAKING A FINE ANNULAR CHARGE STORAGE ELECTRODE IN A SEMICONDUCTOR DEVICE USING A PHASE-SHIFT MASK

[75] Inventors: Chang N. Ahn; Ik B. Hur; Hung E. Kim; Seung C. Moon; Il H. Lee, all of Ichonkun, Rep. of Korea

[73] Assignee: Hyundai Electronics Industries Co., Ltd., Kyoungkido, Rep. of Korea

[21] Appl. No.: 499,705

[22] Filed: Jul. 7, 1995

[30] Foreign Application Priority Data

Jul. 8, 1994 [KR] Rep. of Korea .................. 1994-16510
Jul. 15, 1994 [KR] Rep. of Korea .................. 1994-17164

[51] Int. Cl.$^6$ ............................. H01L 21/70; H01L 27/00
[52] U.S. Cl. .............................. 437/52; 437/60; 437/919; 437/962; 148/DIG. 106
[58] Field of Search .................. 437/47–48, 52, 437/60, 919, 962; 257/303, 306; 148/DIG. 104–106, DIG. 14

[56] References Cited

U.S. PATENT DOCUMENTS

| | | | |
|---|---|---|---|
| 5,380,673 | 1/1995 | Yang et al. | 437/47 |
| 5,413,950 | 5/1995 | Chen et al. | 437/52 |
| 5,447,881 | 9/1995 | Ryou | 437/60 |
| 5,451,539 | 9/1995 | Ryou | 437/60 |

*Primary Examiner*—H. Jey Tsai
*Attorney, Agent, or Firm*—Blakely, Sokoloff, Taylor & Zafman

[57] ABSTRACT

The present invention provides a method for making a fine annular charge storage electrode in a semiconductor device, which is capable of easily forming the charge storage electrode having a double cylinder-shaped structure and a fine annular pattern which is smaller than the wavelength from the light source, using a phase-shift mask. Accordingly, the present invention has an effect in that the reliability of a memory device having the charge storage electrode is improved, by removing the bad contact in the double cylinder-shaped structure, and that the surface of the charge storage electrode can be easily increased from 20% to 80%.

20 Claims, 13 Drawing Sheets

METHOD FOR MAKING A FINE ANNULAR CHARGE STORAGE ELECTRODE IN A SEMICONDUCTOR DEVICE USING A PHASE-SHIFT MASK

BACKGROUND OF THE INVENTION

1. Field of the Invention

The present invention relates to a method for making a fine annular charge storage electrode in a semiconductor device, and more particularly to a method for easily forming a charge storage electrode having a high capacitance and fine annular patterns, using a phase-shift mask.

2. Description of the Prior Art

In recent years, the development of semiconductor devices in which numerous elements are integrated at a high density on a semiconductor chip has been actively under way. For the memory cell of the dynamic random access memory(DRAM), there have been proposed various structures suitable for miniaturization of the device.

Furthermore, to obtain a sufficient capacitance corresponding to decrease of cell are a in a high density device, a device with trench, fin and cylinder-shaped structures has been developed, and ferroelectric materials, such as $TaO_5$ whose dielectric constant is larger than that of the ONO(Oxide-Nitride-Oxide) layer, have been developed. That is to say, modifications of structures of charge storage electrodes and dielectric materials, having a high capacitance, have been developed.

In a conventional method for forming a charge storage electrode in a semiconductor device, the patterns for forming the charge storage electrodes are formed with chromium patterns on a quartz substrate. Accordingly, one chromium pattern formed on the photomask corresponds to one photoresist pattern. Then, to form a charge storage electrode having a cylinder-shaped structure, several lithography processes and etching processes are desired. However, the photomask having chromium patterns, which perfectly intercept the light, can not form charge storage electrodes having a sufficient capacitance, since chromium patterns can not form fine patterns which are smaller than the wavelength from the light source. Also, in formation of the charge storage electrode having the cylinder-shaped structure, although single cylinder structures or more have been developed, it is very difficult to obtain sufficient capacitance, so that there have been many problems in high density devices.

SUMMARY OF THE INVENTION

To solve the above mentioned problems, an object of the present invention is to provide a method for making a fine annular charge storage electrode in a semiconductor device, which is capable of easily forming the charge storage electrode having high capacitance and a fine annular pattern which is smaller than the wavelength from the light source, using a phase-shift mask.

Another object of the present invention is to provide a method for making a fine annular charge storage electrode in a semiconductor device, which is capable of easily forming the charge storage electrode having a double cylinder-shaped structure and a fine annular pattern which is smaller than the wavelength from the light source, using a phase-shift mask.

According to the present invention, a method for forming a charge storage electrode in a semiconductor device is provided, comprising the steps of: depositing a first insulating layer on a substrate having an active region; etching said first insulating layer in order to form a contact hole, thereby exposing said active region; forming a first conducting layer being in contact with the active region through the contact hole; depositing a second insulating layer on said conducting layer for planarization; depositing a photoresist layer on said second insulating layer; exposing said photoresist layer using a phase-shift mask which has a phase-shift material pattern whose width is wider than the wavelength of exposure light, thereby developing a fine annular photoresist layer; etching said second insulating layer and said first conducting layer, using said fine annular photoresist layer as an etching mask; removing said said fine annular photoresist layer; depositing a second conducting layer on the resulting structure; isotopically etching said second conducting layer; and removing said second insulating layer.

According to the present invention, a method for forming a charge storage electrode in a semiconductor device is provided, comprising the steps of: depositing a first insulating layer on a substrate having an active region; etching said first insulating layer in order to form a contact hole, thereby exposing said active region; forming a first conducting layer being in contact with the active region through the contact hole; depositing a second insulating layer on said conducting layer for planarization; depositing a photoresist layer on said second insulating layer; exposing said photoresist layer using a phase-shift mask which has a etched portion whose width is wider than the wavelength of exposure light, thereby developing a fine annular photoresist layer; etching said second insulating layer and said first conducting layer, using said fine annular photoresist layer as an etching mask; removing said said fine annular photoresist layer; depositing a second conducting layer on the resulting structure; isotopically etching said second conducting layer; and removing said second insulating layer.

According to the present invention, a method for forming a charge storage electrode in a semiconductor device is provided, comprising the steps of: depositing a first insulating layer on a substrate having an active region; etching said first insulating layer in order to form a contact hole, thereby exposing said active region; forming a first conducting layer being in contact with the active region through the contact hole; depositing a second insulating layer on said conducting layer for planarization; depositing a photoresist layer on said second insulating layer; exposing said photoresist layer using a phase-shift mask, which has a phase-shift material pattern whose width is wider than the wavelength of exposure light and which, from said phase-shift material pattern, a projecting part whose width is narrower than the wavelength of exposure light, thereby developing a fine annular photoresist layer; etching said second insulating layer and said first conducting layer, using said fine annular photoresist layer as a etching mask; removing said said fine annular photoresist layer; depositing a second conducting layer on the resulting structure; isotopically etching said second conducting layer; and removing said second insulating layer.

According to the present invention, a method for forming a charge storage electrode in a semiconductor device is provided, comprising the steps of: depositing a first insulating layer on a substrate having an active region; etching said first insulating layer in order to form a contact hole, thereby exposing said active region; forming a first conducting layer being in contact with the active region through the contact hole; depositing a second insulating layer on said conducting layer for planarization; depositing a photoresist layer on said second insulating layer; exposing said photoresist layer using a phase-shift mask, which has a etched portion whose width is wider than the wavelength of exposure light and which, from said etched portion, a projecting part whose width is narrower than the wavelength of exposure light, thereby developing a fine annular photoresist layer; etching said second insulating layer and said first conducting layer, using said fine annular photoresist layer as a etching mask; removing said said fine annular photoresist layer; depositing a second conducting layer on the resulting structure; isotopically etching said second conducting layer; and removing said second insulating layer.

BRIEF DESCRIPTION OF THE DRAWINGS

The present invention may be better understood and its numerous objects and advantages will become apparent to those skilled in the art by reference to the accompanying drawings as follow.

DESCRIPTION OF THE PRESENT INVENTION

Hereinafter, a charge storage electrode in accordance with the present invention will be described.

First, a method forming fine annular patterns will be described referring to FIGS. 1A to 1C.

Figure 1A:
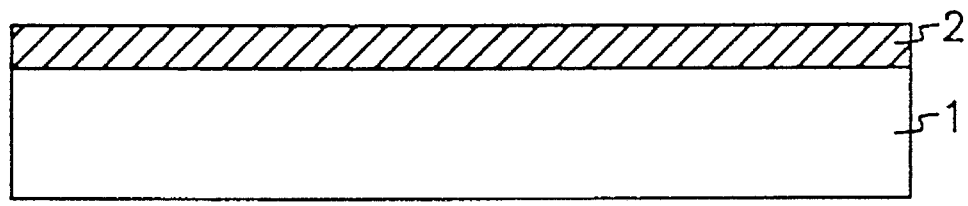
FIGS. 1A to 1C are cross-sectional views illustrating a method for forming a phase-shift mask according to the present invention.

As shown in FIG. 1A, there is a phase-shift material 2 on a substrate 1 such as quartz. The phase-shift material 2 is SOG, PMMA, CYTOP, $SiO_x$, and so forth, but the approximate thickness (d) of the phase-shift material 2 should be formed, considering its refractive index, as follows:

$$d=\frac{1}{2}(n-1)$$

where, n is the refractive index of the phase-shift material 2, it is typically 1.3 to 1.5. Also, the phase-shift material 2 has permeability as to visible light and far ultraviolet light.

Figure 1B:
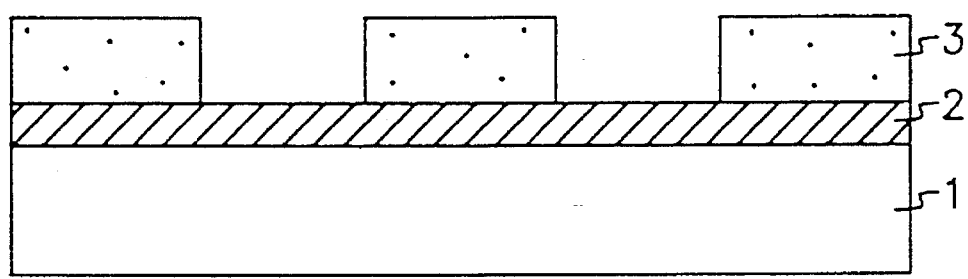

As shown in FIG. 1B, a photoresist layer is deposited on the phase-shift material 2, a photoresist pattern 3 is uniformly formed by the exposing process and the developing process.

Figure 1C:
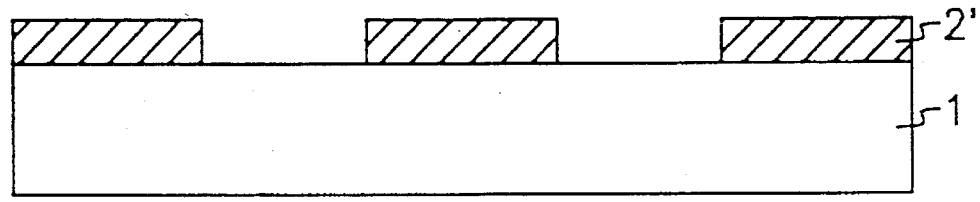

Next, as shown in FIG. 1C, the phase-shift material 2 is etched using the photoresist pattern 3 as a etching mask, until the surface of the substrate 1 is exposed, then, phase-shift material patterns 2' are formed on the substrate 1. At this time, inorganic substances, such as SOG, CYTOP and $SiO_x$, are applied to dry-etching with fluoride plasma and organic substances, such as PMMA, are applied to dry-etching with oxygen plasma, so that excellent patterns can be obtained.

Figure 2:
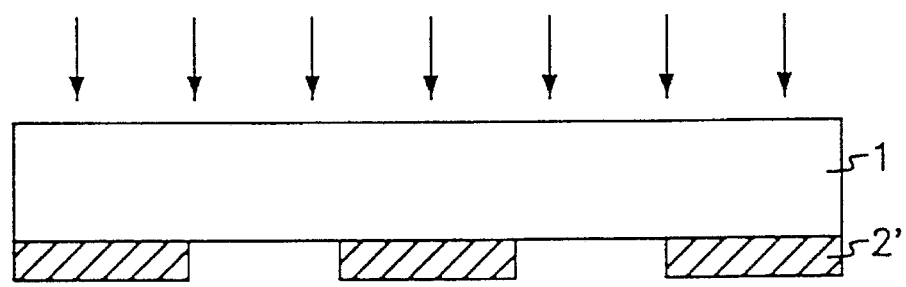
FIGS. 2 is a view showing the distribution of the exposure light through the phase-shift mask in FIG. 1C.
Figure 2:
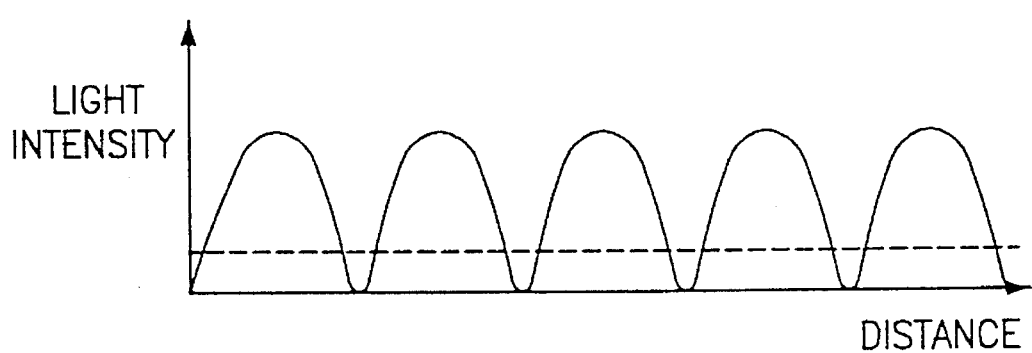

When a photomask, having phase-shift material patterns 2' is, as shown in FIG. 2, exposed by visible light or far ultraviolet light, the phase in a portion where there is no the phase-shift material 2 is 0, and phase in a portion where there is the phase-shift material 2, is π. That is to say, a boundary between a portion where there is no the phase-shift material 2 and a portion where there is the phase-shift material 2 is out of phase, as shown on a plot in FIG. 2. The broken lines, in FIG. 2, designate a critical intensity capable of developing the phase-shift material 2, that is, the light intensity below the broken lines can not develope the phase-shift material 2.

Figure 3:
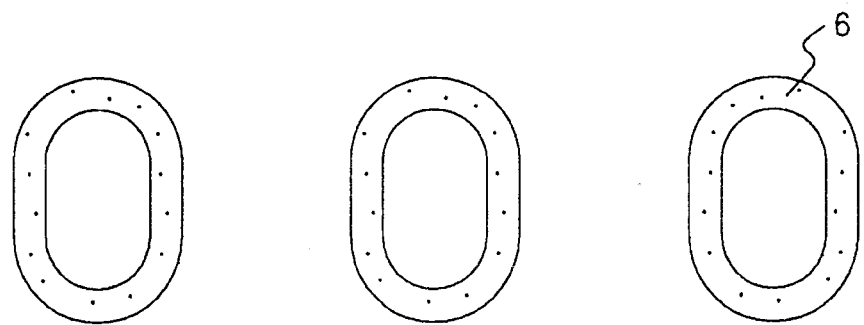
FIG. 3 is a views showing fine annular photoresist patterns formed using the phase-shift mask in FIG. 1C.

FIG. 3 is a view showing fine annular photoresist patterns 6 formed using the phase-shift mask in FIG. 1C.

Figure 4:
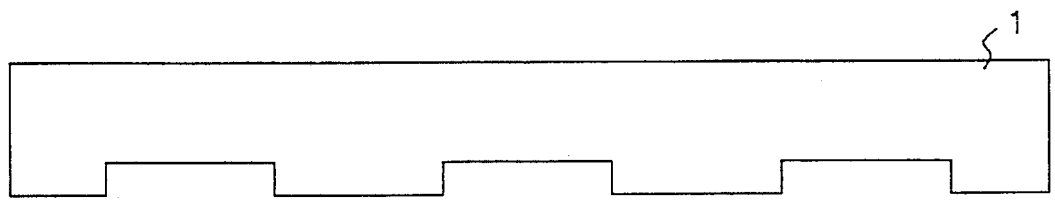
FIG. 4 is a cross-sectional view showing a method for forming another phase-shift mask according to the present invention.

FIG. 4 is a cross-sectional view showing a method for forming another phase-shift mask. As shown in FIG. 4, the phase-shift mask is made by etching a portion of the substrate 1, this mask has the same effect as the above the phase-shift mask in FIG. 1C.

Hereinafter, the first embodiment of the present invention will be described.

Figure 5:
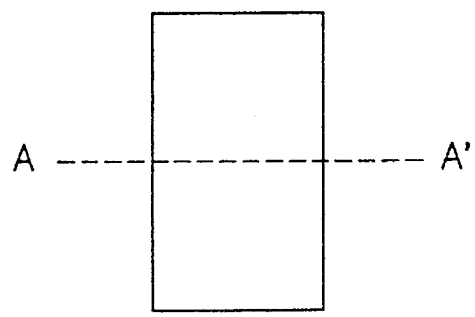
FIG. 5 is a top plan view showing a phase-shift mask in order to form a charge storage electrode having a double cylinder-shaped structure according to the first embodiment of the present invention.
Figure 6:
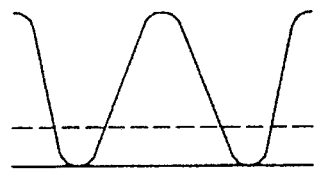
FIG. 6 is a view showing the distribution of the exposure light along line A—A' through the phase-shift mask in FIG. 5.

As mentioned above, the phase-shift mask has characteristics in that interference occurs only on the outskirts of the phase-shift material, thereby destroying the light intensity. Accordingly, in the case of using the phase-shift mask having a phase-shift material pattern, as shown in FIG. 5, which is formed on a substrate, or an etched portion of a substrate, the light intensity has the distribution as shown in FIG. 6. Although the phase-shift material pattern has a quadrilateral, it is not restricted to the shape. Of course, if the phase-shift material pattern has a certain area, fine annular patterns can be formed.

FIG. 6 shows the distribution of the exposure light along line A—A' through the phase-shift mask in FIG. 5. The broken lines, in FIG. 6, designate a critical intensity capable of developing phase-shift material. That is to say, the light intensity below the broken lines can not develope the phase-shift material since the light intensity on the outskirts of the phase-shift material or the etched portion is very low.

Figure 7:
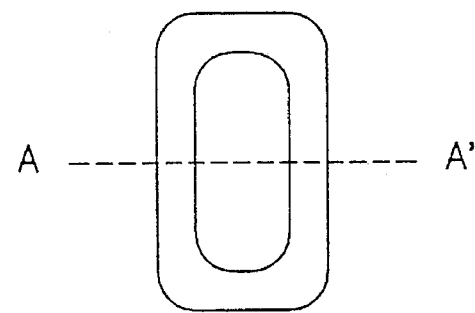
FIG. 7 is a top plan view showing a photoresist pattern developed by the phase-shift mask in FIG. 5.

Also, FIG. 7 shows a photoresist pattern developed by the phase-shift mask in FIG. 5.

Referring to FIGS. 8A to 8D, a method for forming a charge storage electrode using a photoresist pattern in FIG. 7 will be described.

Figure 8A:
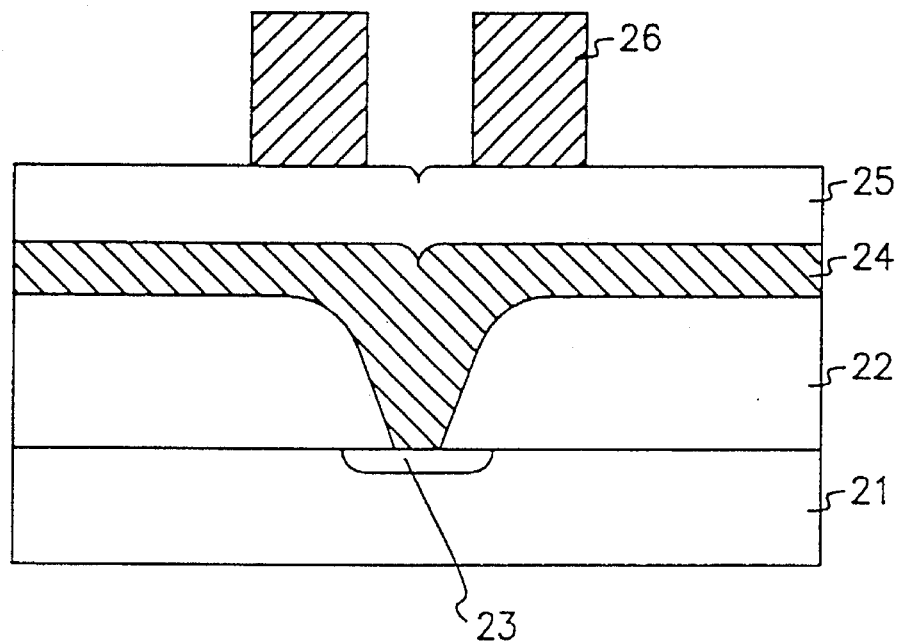
FIGS. 8A to 8D are cross-sectional views showing a method for forming a charge storage electrode having double cylinder-shaped structure, using the phase-shift mask in FIG. 5.

First, as shown in FIG. 8A, a oxide layer 22, which is insulating inter-layers, is formed on a substrate 21 having an active region 23, a contact hole is formed by etching a portion of the oxide layer 22 over the active region 23, and a polysilicon layer 24, as a charge storage electrode, is in contact with the active region 23 through the contact hole. A oxide layer 25, for planarization, is formed on the resulting structure, and a photoresist pattern 26, which is developed by the phase-shift mask in FIG. 5, is formed on the oxide layer 25.

Figure 8B:
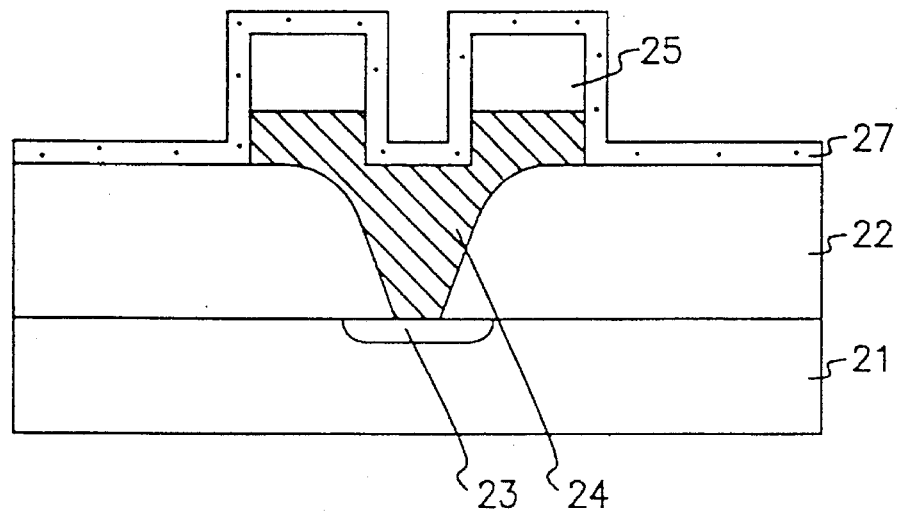

Next, as shown in FIG. 8B, the oxide layer 25 and the polysilicon layer 24 are, in turn, etched by using the photoresist pattern 26 as an etching mask, and a polysilicon layer 27 is formed on the resulting structure. Particularly, to prevent the polysilicon layer 27 from being cut at the time of etching the polysilicon layer 27 and the photoresist pattern 26, in FIG. 8A, must be precisely positioned, and the etching rate of the polysilicon layer 27 must be precisely controlled.

Figure 8C:
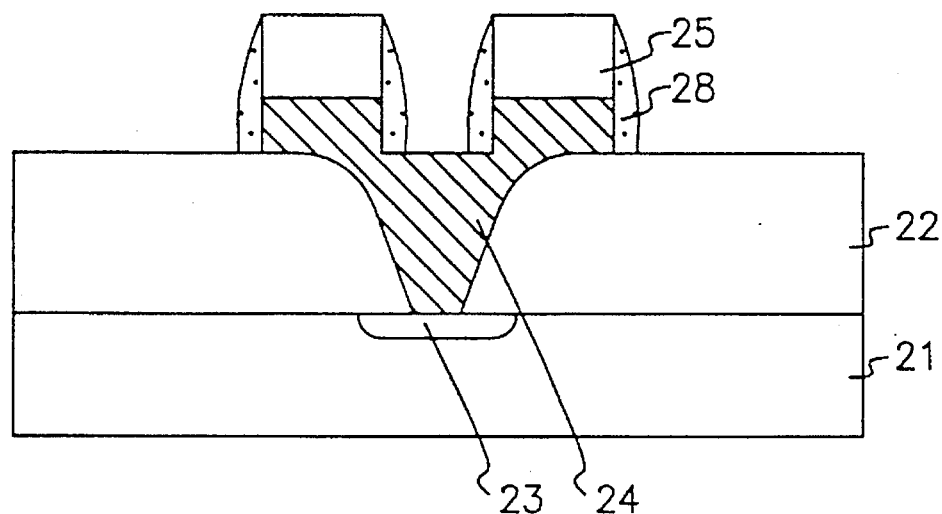

As shown in FIG. 8C, the polysilicon layer 27 is isotopically etched so that a spacer polysilicon layer 28 is formed on the sidewall of the oxide layer 25 and the polysilicon layer 24.

Figure 8D:
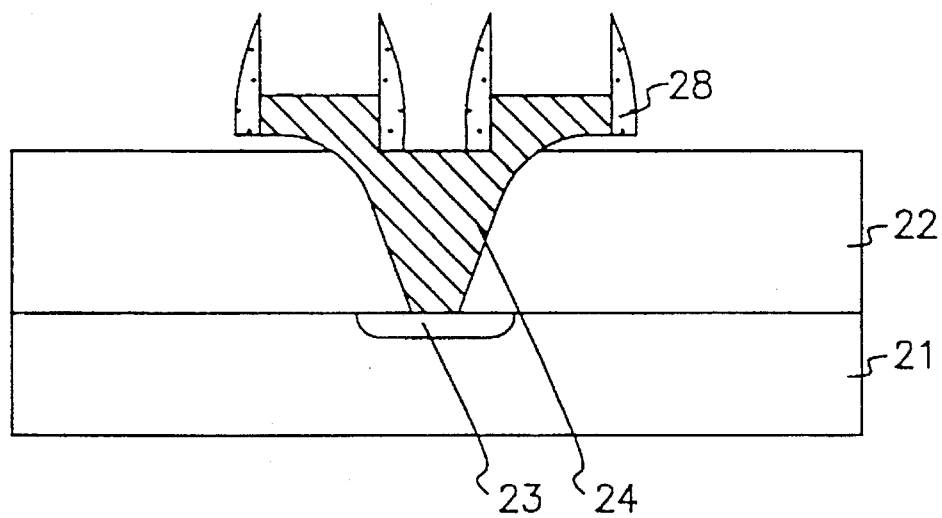

Finally, as shown in FIG. 8D, the charge storage electrode, in accordance with the first embodiment of the present invention, is formed by etching the oxide layer 25. At this time, the upper portion of the oxide layer 22 can be etched in order to increase the surface area of the charge storage electrode.

Hereinafter, a method for forming a charge storage electrode in accordance with the second embodiment of the present invention will be described.

Figure 10:
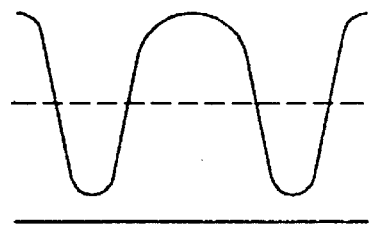
FIG. 10 is a view showing the distribution of the exposure light along line A—A' through the phase-shift mask in FIG. 9.
Figure 11:
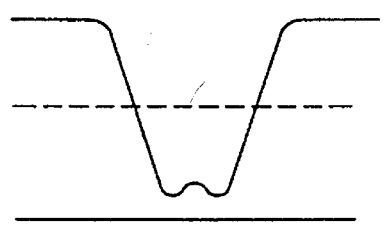
FIG. 11 is a view showing the distribution of a n exposure light along line B—B' through the phase-shift mask in FIG. 9.

Phase shift material in the second embodiment has a projecting part. Accordingly, the distribution of the exposure light can be classified into two parts. FIG. 10 shows the distribution of the exposure light along line A—A' through the phase-shift mask in FIG. 9, and FIG. 11 shows the distribution of the exposure light along line B—B' through the phase-shift mask in FIG. 9, in the same manner as FIG. 6.

Figure 9:
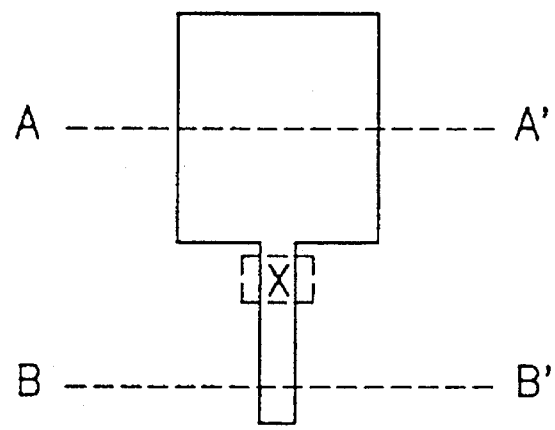
FIG. 9 is a top plan view showing a phase-shift mask in order to form a charge storage electrode having double cylinder-shaped structure according to the second embodiment of the present invention.
Figure 12:
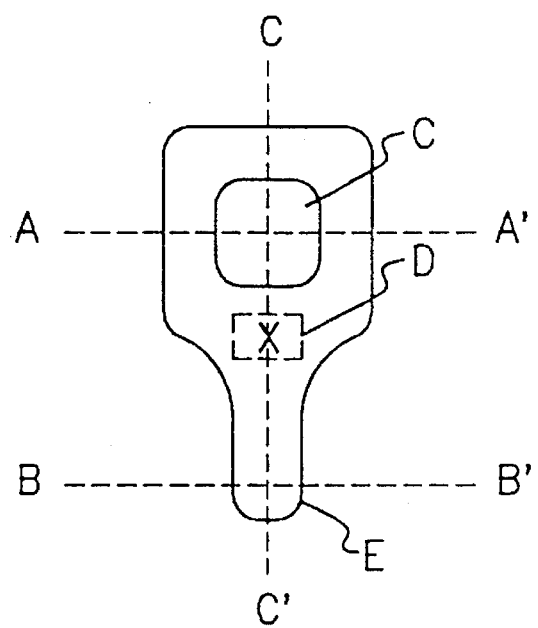
FIG. 12 is a top plan view showing a photoresist pattern developed by the phase-shift mask in FIG. 9.
Figure 13:
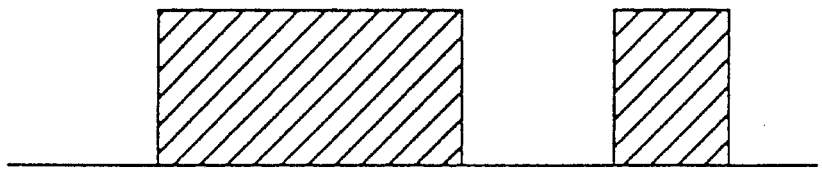
FIG. 13 is a cross-sectional view showing a photoresist pattern along line C—C' in FIG. 12.
Figure 14A:
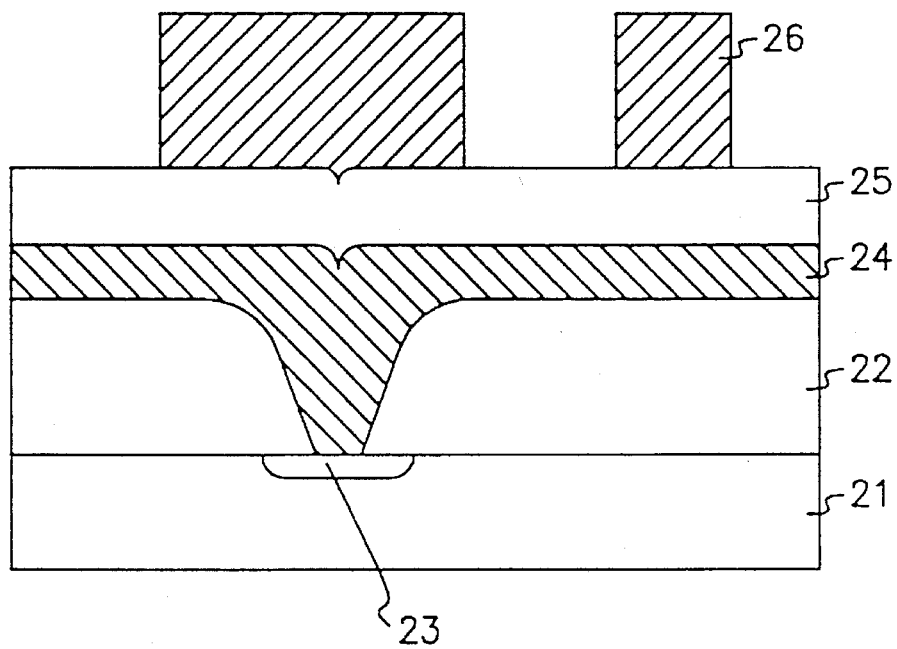
FIGS. 14A to 14D are cross-sectional views showing a method for forming a charge storage electrode having a double cylinder-shaped structure, using the phase-shift mask in FIG. 9.
Figure 14B:
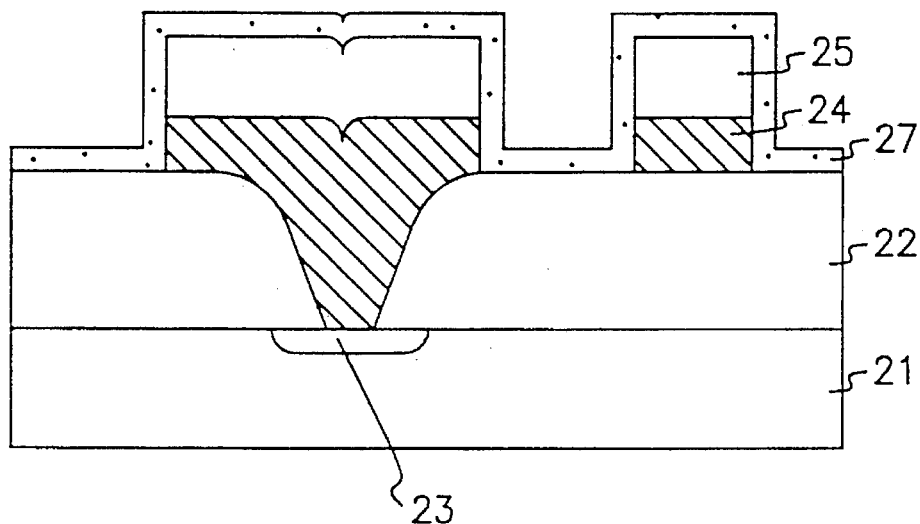
Figure 14C:
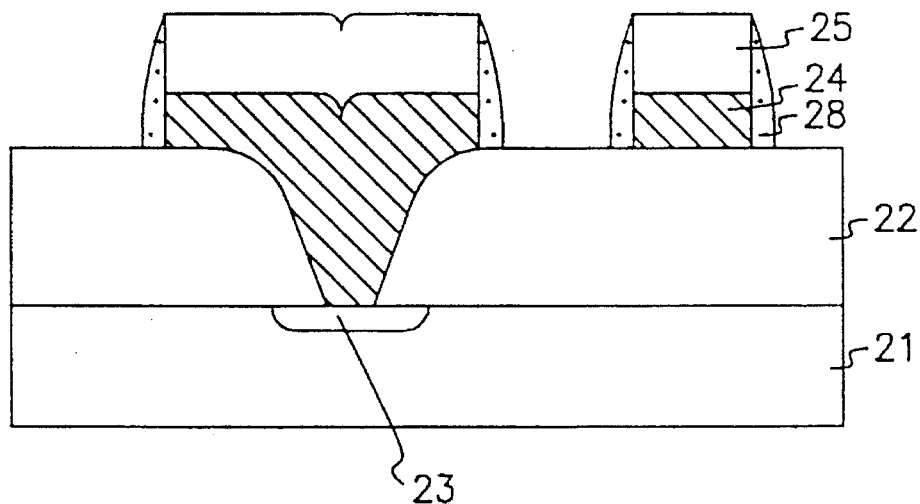
Figure 14D:
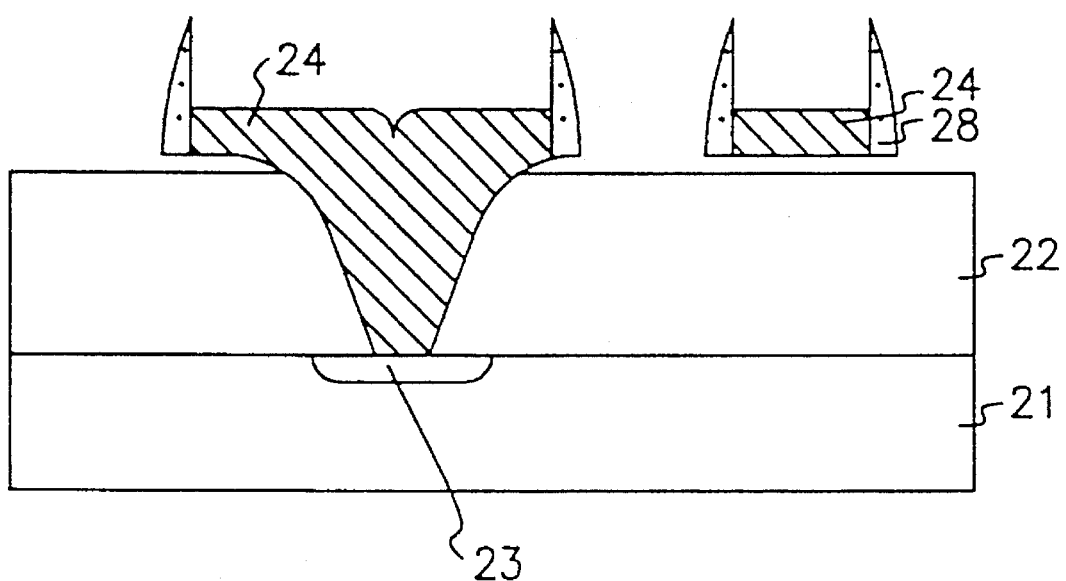

Also, a photoresist pattern developed by the phase-shift mask in FIG. 9 is shown in FIG. 12, and FIG. 13 is a cross-sectional view showing a photoresist pattern along line C—C' in FIG. 12.

FIGS. 14A to 14D shows a method for forming a charge storage electrode, using a photoresist pattern in FIG. 12, along line C—C'. As shown in FIGS. 14A to 14D, a method for forming a charge storage electrode, in accordance with the second embodiment, is performed in the same manner as the process described in FIGS. 8A to 8D, also, the same reference numerals as those in FIGS. 8A to 8D designate the same layers.

In the second embodiment, the photoresist pattern, as shown in FIG. 12, can solve the problems which are generated in the case where phase-shift material is not precisely positioned over the center of the contact hole as illustrated in the first embodiment. That is to say, the position of the contact portion (the reference numeral D) is different from the center position C of the phase-shift material. The charge storage electrode is in contact with the active region below the projecting part D, to overcome a bad contact and not to desire control of the precise etching rate of the polysilicon layer 24. The design can be optimized, by using the principle that the annular pattern, as shown in FIG. 13, are formed in the case where the width of the phase-shift material is much wider than the wavelength of the exposure light, and that the annular pattern may not be formed in the case where the width of the phase-shift material is similar to or narrower than the wavelength of the exposure light.

Figure 15:
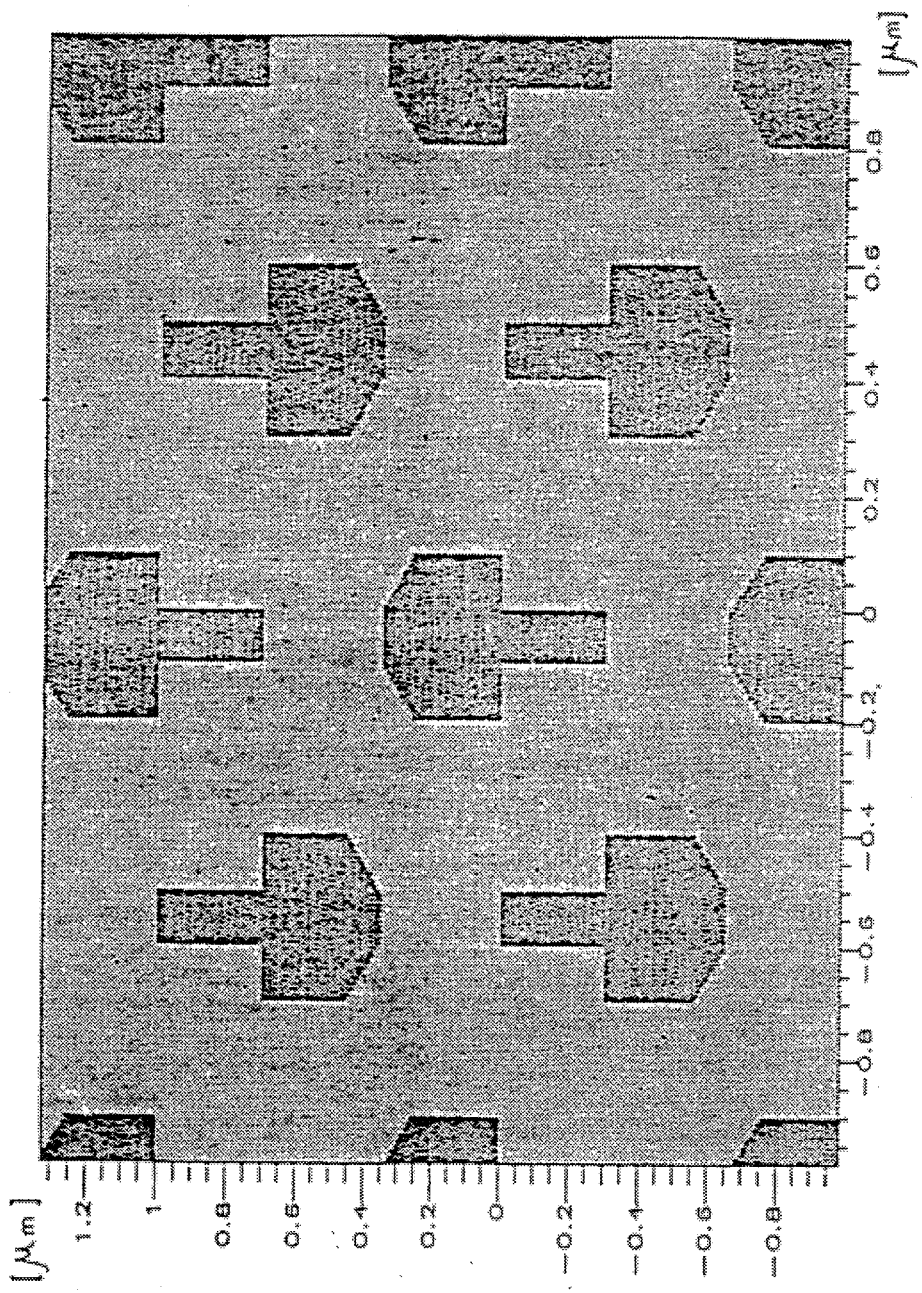
FIG. 15 is a top plan view showing a phase-shift mask having the charge storage electrode patterns according to the second embodiment of the present invention.

FIG. 15 shows a phase-shift mask having the charge storage electrode patterns according to the second embodiment of the present invention. In FIG. 15, the size of the cell is 0.5 µm×1.0 µm and the design rule is 0.25 µm. This phase-shift mask can be applied to a 256M device.

Figure 16:
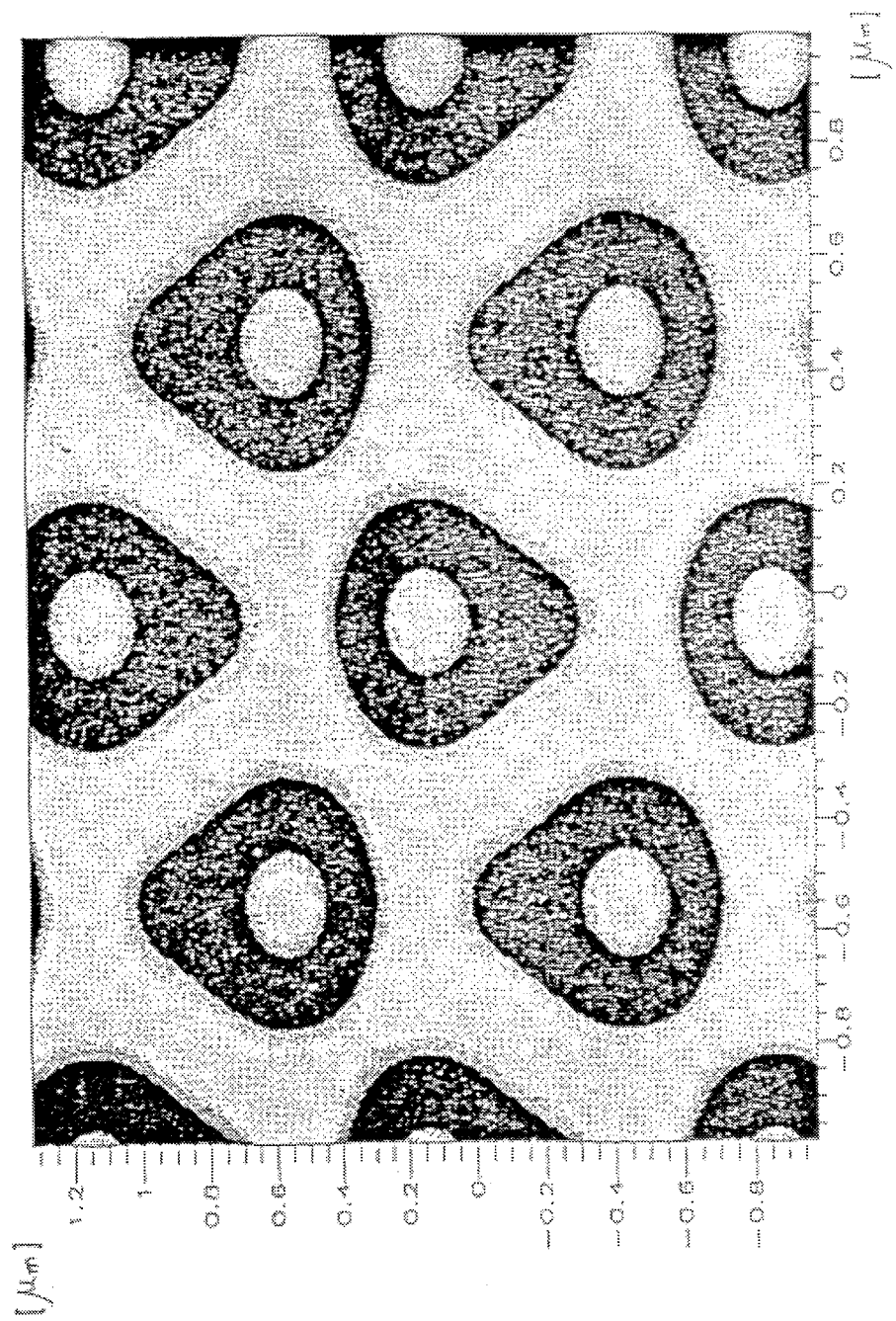
FIG. 16 is a top plan view showing photoresist patterns developed by the phase-shift mask in FIG. 15.

FIG. 16 shows photoresist patterns developed by the phase-shift mask in FIG. 15 and the KrF laser (wavelength is 248 nm).

The present invention, as stated above, has an effect in that the reliability of a memory device having the charge storage electrode is improved by removing the bad contact in the double cylinder-shaped structure, and that the surface of the charge storage electrode can be easily increased from 20% to 80%.

What is claimed is:

1. A method for forming a charge storage electrode in a memory device, comprising the steps of:

depositing a first insulating layer on a substrate having an active region;

etching said first insulating layer in order to form a contact hole, thereby exposing said active region;

forming a first conducting layer being in contact with the active region through the contact hole;

depositing a second insulating layer on said first conducting layer for planarization;

depositing a photoresist layer on said second insulating layer;

exposing said photoresist layer using a phase-shift mask which has a phase-shift material pattern whose width is wider than a wavelength of an exposure light, thereby developing a fine annular photoresist pattern for forming said charge storage electrode having a fine annular pattern which is smaller than said wavelength of said exposure light;

etching said second insulating layer and said first conducting layer, using said fine annular photoresist pattern as an etching mask;

removing said fine annular photoresist pattern;

depositing a second conducting layer on said substrate after said etching said second insulating layer and said first conducting layer;

isotopically etching said second conducting layer; and removing said etched second insulating layer.

2. A method in accordance with claim 1, wherein the step of removing said etched second insulating layer further comprises a step of removing an upper portion of said first insulating layer.

3. A method in accordance with claim 1, wherein a thickness of a layer of said phase-shift material pattern is approximately ½(n−1), (where, n is a refractive index of a phase-shift material).

4. A method in accordance with claim 1, wherein said phase-shift material pattern comprises of inorganic substances.

5. A method in accordance with claim 1, wherein said phase-shift material pattern comprises of organic substances.

6. A method for forming a charge storage electrode in a memory device, comprising the steps of:

depositing a first insulating layer on a substrate having an active region;

etching said first insulating layer in order to form a contact hole, thereby exposing said active region;

forming a first conducting layer being in contact with the active region through the contact hole;

depositing a second insulating layer on said first conducting layer for planarization;

depositing a photoresist layer on said second insulating layer;

exposing said photoresist layer using a phase-shift mask which has an etched portion whose width is wider than a wavelength of an exposure light, thereby developing a fine annular photoresist pattern for forming said charge storage electrode having a fine annular pattern which is smaller than said wavelength of said exposure light;

etching said second insulating layer and said first conducting layer, using said fine annular photoresist pattern as an etching mask;

removing said fine annular photoresist pattern;

depositing a second conducting layer on said substrate after said etching said second insulating layer and said first conducting layer;

isotopically etching said second conducting layer; and removing said etched second insulating layer.

7. A method in accordance with claim 6, wherein the step of removing said etched second insulating layer further comprises a step of removing an upper portion of said first insulating layer.

8. A method in accordance with claim 6, wherein the phase-shift mask is coated with a phase-shift material pattern having a thickness of approximately ½(n−1)

(where n is a refractive index of a phase-shift material).

9. A method in accordance with claim 8, wherein said phase-shift material pattern comprises inorganic substances.

10. A method in accordance with claim 8, wherein said phase-shift material pattern comprises organic substances.

11. A method for forming a charge storage electrode in a memory device, comprising the steps of:

depositing a first insulating layer on a substrate having an active region;

etching said first insulating layer in order to form a contact hole, thereby exposing said active region;

forming a first conducting layer being in contact with the active region through the contact hole;

depositing a second insulating layer on said first conducting layer for planarization;

depositing a photoresist layer on said second insulating layer;

exposing said photoresist layer using a phase-shift mask, which has a phase-shift material pattern whose width is wider than a wavelength of an exposure light and which, from said phase-shift material pattern, a projecting part whose width is narrower than the wavelength of the exposure light, thereby developing a fine annular photoresist pattern for forming said charge storage electrode having a fine annular pattern which is smaller than said wavelength of said exposure light;

etching said second insulating layer and said first conducting layer, using said fine annular photoresist pattern as an etching mask;

removing said fine annular photoresist pattern;

depositing a second conducting layer on said substrate after said etching said second insulating layer and said first conducting layer;

isotopically etching said second conducting layer; and removing said etched second insulating layer.

12. A method in accordance with claim 11, wherein the step of removing said etched second insulating layer further comprises a step of removing an upper portion of said first insulating layer.

13. A method in accordance with claim 11, wherein thickness of a layer of said phase-shift material pattern is approximately ½(n−1), (where, n is a refractive index of a phase-shift material).

14. A method in accordance with claim 11, wherein said phase-shift material pattern comprises of inorganic substances.

15. A method in accordance with claim 11, wherein said phase-shift material pattern comprises of organic substances.

16. A method for forming a charge storage electrode in a memory device, comprising the steps of:

depositing a first insulating layer on a substrate having an active region;

etching said first insulating layer in order to form a contact hole, thereby exposing said active region;

forming a first conducting layer being in contact with the active region through the contact hole;

depositing a second insulating layer on said first conducting layer for planarization;

depositing a photoresist layer on said second insulating layer;

exposing said photoresist layer using a phase-shift mask, which has an etched portion whose width is wider than a wavelength of an exposure light and which, from said etched portion, a projecting part whose width is narrower than the wavelength of said exposure light, thereby developing a fine annular photoresist pattern for forming said charge storage electrode having a fine annular pattern which is smaller than said wavelength of said exposure light;

etching said second insulating layer and said first conducting layer, using said fine annular photoresist pattern as an etching mask;

removing said fine annular photoresist pattern;

depositing a second conducting layer on said substrate after said etching said second insulating layer and said first conducting layer;

isotopically etching said second conducting layer; and removing said etched second insulating layer.

17. A method in accordance with claim 16, wherein the step of removing said etched second insulating layer further comprises a step of removing an upper portion of said first insulating layer.

18. A method in accordance with claim 16, wherein the phase-shift mask is coated with a phase-shift material pattern having a thickness of approximately ½(n−1), (where, n is a refractive index of a phase-shift material).

19. A method in accordance with claim 18, wherein said phase-shift material pattern comprises inorganic substances.

20. A method in accordance with claim 18, wherein said phase-shift material pattern comprises organic substances.

* * * * *